US012211716B2

(12) United States Patent
Lee et al.

(10) Patent No.: US 12,211,716 B2
(45) Date of Patent: Jan. 28, 2025

(54) SUBSTRATE PROCESSING APPARATUS AND SUBSTRATE PROCESSING METHOD

(71) Applicants: Semes Co., Ltd., Cheonan-si (KR); Samsung Electronics Co., Ltd., Suwon-si (KR)

(72) Inventors: Jaeseong Lee, Hwaseong-si (KR); Kihoon Choi, Cheonan-si (KR); Hae-Won Choi, Daejeon (KR); Jihoon Jeong, Seongnam-si (KR); Seohyun Kim, Hwaseong-si (KR); Young-Hoo Kim, Yongin-si (KR); Sangjine Park, Suwon-si (KR); Kuntack Lee, Suwon-si (KR)

(73) Assignees: Semes Co., Ltd., Cheonan-si (KR); Samsung Electronics Co., Ltd., Suwon-si (KR)

( * ) Notice: Subject to any disclaimer, the term of this patent is extended or adjusted under 35 U.S.C. 154(b) by 405 days.

(21) Appl. No.: 17/664,243

(22) Filed: May 20, 2022

(65) Prior Publication Data

US 2022/0415680 A1 Dec. 29, 2022

(30) Foreign Application Priority Data

Jun. 29, 2021 (KR) ........................ 10-2021-0084651

(51) Int. Cl.
*H01L 21/67* (2006.01)
*H01L 21/687* (2006.01)
(52) U.S. Cl.
CPC .. *H01L 21/67225* (2013.01); *H01L 21/67023* (2013.01); *H01L 21/68785* (2013.01)

(58) Field of Classification Search
None
See application file for complete search history.

(56) References Cited

U.S. PATENT DOCUMENTS

| 7,033,089 B2 | 4/2006 | Takasu et al. |
| 7,264,008 B2 | 9/2007 | Kim et al. |
| 7,361,231 B2 | 4/2008 | Fury et al. |
| 7,900,373 B2 | 3/2011 | Reitinger |
| 8,899,248 B2 | 12/2014 | Collins et al. |

(Continued)

FOREIGN PATENT DOCUMENTS

| KR | 10-2004-0011829 A | 2/2004 |
| KR | 10-2018-0086165 A | 7/2018 |

*Primary Examiner* — Hsien Ming Lee
(74) *Attorney, Agent, or Firm* — DALY, CROWLEY, MOFFORD & DURKEE, LLP

(57) ABSTRACT

A substrate processing apparatus includes a chamber including an upper chamber and a lower chamber coupled to each other to provide a space for processing a substrate, a substrate support configured to support the substrate within the chamber, an upper supply port provided in the upper chamber and configured to supply a supercritical fluid on an upper surface of the substrate within the chamber, a recess provided in a lower surface of the upper chamber, the recess including a horizontal extension portion extending in a direction parallel with the upper surface of the substrate in a radial direction from an outlet of the upper supply port and an inclined extension portion extending obliquely at an angle from the horizontal extension portion, and a baffle member disposed within the recess between the upper supply port and the substrate.

16 Claims, 7 Drawing Sheets

(56) References Cited

U.S. PATENT DOCUMENTS

| | | |
|---|---|---|
| 2004/0020520 A1 | 2/2004 | Kim et al. |
| 2004/0123484 A1 | 7/2004 | Yoshikawa et al. |
| 2014/0341682 A1* | 11/2014 | Yang .................... H01L 21/677 414/226.05 |
| 2020/0303182 A1* | 9/2020 | Jang .................. H01L 21/68742 |
| 2020/0350147 A1* | 11/2020 | Wang ................ H01J 37/32834 |

* cited by examiner

SUBSTRATE PROCESSING APPARATUS AND SUBSTRATE PROCESSING METHOD

PRIORITY STATEMENT

This application claims priority under 35 U.S.C. § 119 to Korean Patent Application No. 10-2021-0084651, filed on Jun. 29, 2021 in the Korean Intellectual Property Office (KIPO), the contents of which are herein incorporated by reference in their entirety.

BACKGROUND

1. Field

Example embodiments relate to a substrate processing apparatus and a substrate processing method. More particularly, example embodiments relate to a substrate processing apparatus configured to dry a substrate using a supercritical fluid and a substrate processing method using the same.

2. Description of the Related Art

After performing a developing process of an EUV photoresist layer, a drying process using a supercritical fluid may be performed to dry a substrate including a developer coated thereon. In a substrate processing apparatus using such a supercritical fluid, a high-pressure supercritical fluid may be supplied to an upper surface of the substrate at a high speed from a fluid supply port having a relatively small diameter. When the fluid having a high speed collides with the substrate, the chemical applied on the substrate may be momentarily pushed out, and drying may occur in a state where the density of the fluid is not sufficiently increased, and thus, defects such as pattern collapse may occur.

SUMMARY

Example embodiments provide a substrate processing apparatus capable of efficiently drying a substrate without leaving particles.

According to example embodiments, a substrate processing apparatus includes a chamber including an upper chamber and a lower chamber coupled to each other to provide a space for processing a substrate, a substrate support configured to support the substrate within the chamber, an upper supply port provided in the upper chamber and configured to supply a supercritical fluid on an upper surface of the substrate within the chamber, a recess provided in a lower surface of the upper chamber, the recess including a horizontal extension portion extending in a direction parallel with the upper surface of the substrate in a radial direction from an outlet of the upper supply port and an inclined extension portion extending obliquely at an angle from the horizontal extension portion, and a baffle member disposed within the recess between the upper supply port and the substrate, the baffle member including at least one baffle plate having a plurality of holes.

According to example embodiments, a substrate processing apparatus includes a chamber configured to provide a space for processing a substrate, a substrate support configured to support the substrate within the chamber, an upper supply port provided in an upper portion of the chamber and configured to supply a supercritical fluid on an upper surface of the substrate, a recess provided in the upper portion of the chamber, the recess extending radially from an outlet of the upper supply port, and a baffle member disposed within the recess, the baffle member including at least one baffle plate, the at least one baffle plate extending in a direction parallel with the upper surface of the substrate and having a plurality of holes.

According to example embodiments, a substrate processing apparatus includes a chamber including an upper chamber and a lower chamber coupled to each other to provide a space for processing a substrate, a substrate support configured to support the substrate within the chamber, an upper supply port provided in the upper chamber and configured to supply a supercritical fluid on an upper surface of the substrate within the chamber, an exhaust port provided in the lower chamber and configured to exhaust a fluid from the chamber, a lower supply port provided in the lower chamber adjacent to the exhaust port and configured to supply a supercritical fluid into the chamber, and a baffle member provided between the upper supply port and the substrate, the baffle member including a base plate fixedly installed in the upper chamber by a plurality of support rods that extend downward from a lower surface of the upper chamber and having a cavity in a central region and at least one baffle plate extending in a direction parallel with the upper surface of the substrate and having a plurality of holes.

According to example embodiments, a substrate processing apparatus may include a baffle member provided between an upper supply port and a substrate in a recess that is formed in an upper wall of a chamber and having at least one baffle plate that has a plurality of holes. The baffle member may reduce a speed of a supercritical fluid supplied to an upper surface of the substrate through an upper supply port and reduce a differential pressure of the fluid between the center and the edge of the substrate.

Thus, in a process of drying a developer using the supercritical fluid after a developer treatment process during a semiconductor photolithography process, an inertia force transmitted to the upper surface of the substrate by the supercritical fluid may be reduced to prevent rupture of a liquid film of a rinse chemical or damage such as collapse of a pattern on the substrate.

BRIEF DESCRIPTION OF THE DRAWINGS

Example embodiments will be more clearly understood from the following detailed description taken in conjunction with the accompanying drawings.

FIG. 1 is a plan view illustrating a substrate processing apparatus in accordance with example embodiments.

FIG. 2 is a cross-sectional view illustrating a substrate processing apparatus in accordance with example embodiments.

FIG. 3 is a cross-sectional view illustrating a chamber of the substrate processing apparatus of FIG. 2, wherein the chamber is in an open state.

FIG. 4 is a perspective view illustrating a substrate support of the substrate processing apparatus of FIG. 2.

FIG. 5 is an enlarged cross-sectional view illustrating a baffle member of the substrate processing apparatus of FIG. 2.

FIG. 6 is a partially cutaway perspective view illustrating a portion of the baffle member in FIG. 5.

FIG. 7 is a graph illustrating a differential pressure of a fluid between a center and an edge region of a wafer in case that the baffle member of FIG. 5 is installed.

FIG. 8 is a partially cutaway perspective view illustrating a portion of a baffle member in accordance with example embodiments.

FIG. 9 is a partially cutaway perspective view illustrating a portion of a baffle member in accordance with example embodiments.

DETAILED DESCRIPTION OF EXAMPLE EMBODIMENTS

Hereinafter, example embodiments will be explained in detail with reference to the accompanying drawings.

Figure 1:
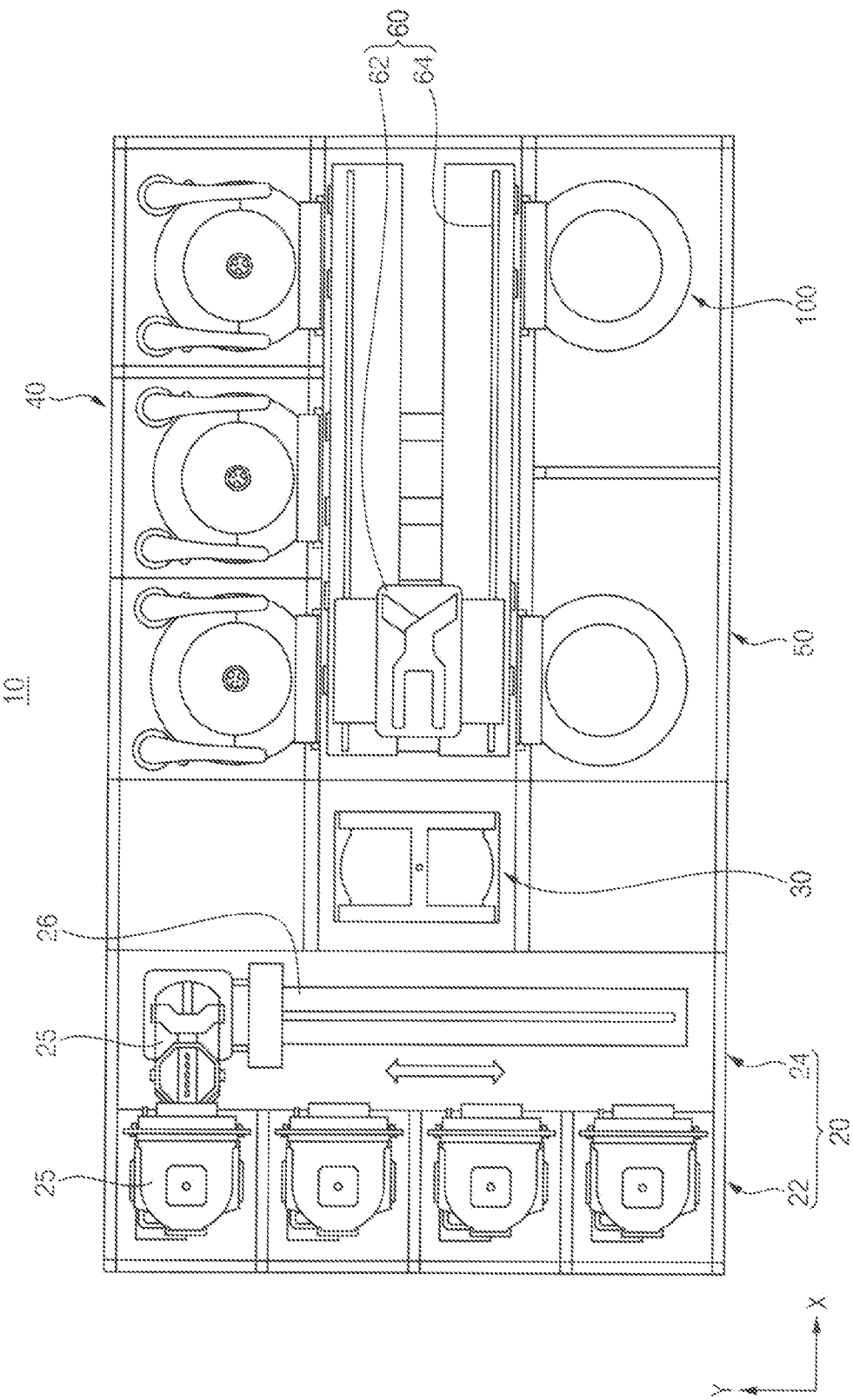
FIGS. 1 to 9 represent non-limiting, example embodiments as described herein.

FIG. 1 is a plan view illustrating a substrate processing apparatus in accordance with example embodiments.

Referring to FIG. 1, a substrate processing apparatus 10 may include an index module 20 configured to load and unload substrates such as wafers, and a process module disposed in one side of the index module 20 and configured to sequentially perform cleaning processes on the wafers. The index module 20 may include a load port 22 and a transfer frame 24. The process module may include a buffer chamber 30, a first process chamber 40, a second process chamber 50 and a transfer chamber 60.

In example embodiments, the substrate processing system 10 may perform a cleaning process and a drying process on the substrate. For example, the first process chamber 40 may perform the cleaning process in which a chemical process, a rinse process and an organic solvent process are sequentially performed, and the second process chamber 50 may perform the drying process using a supercritical fluid.

As illustrated in FIG. 1, the load port 22 may be a port on which the substrate is loaded or unloaded, and a plurality of support plates may be arranged in the load port 22 along a Y direction. A front opening unified pod (FOUP) 22 in which a plurality of the wafers W is accommodated, as a wafer carrier may be supported on the support plate. An indexer robot 25 may be movable along an index rail 26 extending in the Y direction, and may transfer the wafer between the wafer carrier 22 on the load port 22 and the process module.

The process module may be disposed in one side of the index module 20 along an X direction. The buffer chamber 30 may be disposed in one side of the transfer frame 24. The transfer chamber 60 may extend in a direction parallel to the X direction from the buffer chamber 30. The first process chambers 40 may be disposed in a first side of the transfer chamber 60. The second process chambers 50 may be disposed in a second side of the transfer chamber 60 opposite to the first side. The first process chambers 40 may be disposed along the X direction. The second process chamber 50 may be disposed along the X direction. Each of the first process chambers 40 may include a plurality of cleaning apparatuses stacked in multiple stages in a vertical direction. Each of the second process chambers 50 may include a plurality of substrate processing apparatuses 100 stacked in multiple stages in the vertical direction.

The buffer chamber 30 may provide a space in which the wafer W to be transferred from the transfer frame 22 to the first process chamber 40 and the wafer W to be transferred from the second process chamber 50 to the transfer frame 22 temporarily stay. In the first process chamber 40, a cleaning process may be performed on the wafer W. In the first process chamber 40, a chemical process, a rinse process and an organic solvent process may be sequentially performed. In the second process chamber 50, a drying process using a supercritical fluid may be performed on the wafer W on which the cleaning process has been performed.

The transfer chamber 60 for transferring the wafer W may be provided between the first process chamber 40 and the second process chamber 50. A transfer robot 62 may transfer the wafer W while moving along a transfer rail 64 extending in the X direction. The transfer robot 62 may transfer the wafer W placed in the buffer chamber 30 to the first process chamber 40. The transfer robot 62 may transfer the wafer W on which the cleaning process has been performed in the first process chamber 40, to the second process chamber 50. The transfer robot 62 may transfer the wafer W on which the drying process has been performed in the second process chamber 50, to the buffer chamber 30.

In example embodiments, the first process chamber 40 and the second process chamber 50 may be provided to sequentially perform processes on one wafer W. For example, a chemical process, a rinse process and a first drying process may be sequentially performed on the wafer W in the first process chamber 40, and a secondary drying process may be performed in the second process chamber 50. In this case, the primary drying process may be performed using an organic solvent, and the secondary drying process may be performed using a supercritical fluid. The organic solvent may include isopropyl alcohol (IPA) liquid, and the supercritical fluid may include carbon dioxide ($CO_2$). Alternatively, the first primary drying process in the first process chamber 40 may be omitted.

Hereinafter, the substrate processing apparatus 100 of the second process chamber 50 will be described in detail.

Figure 2:
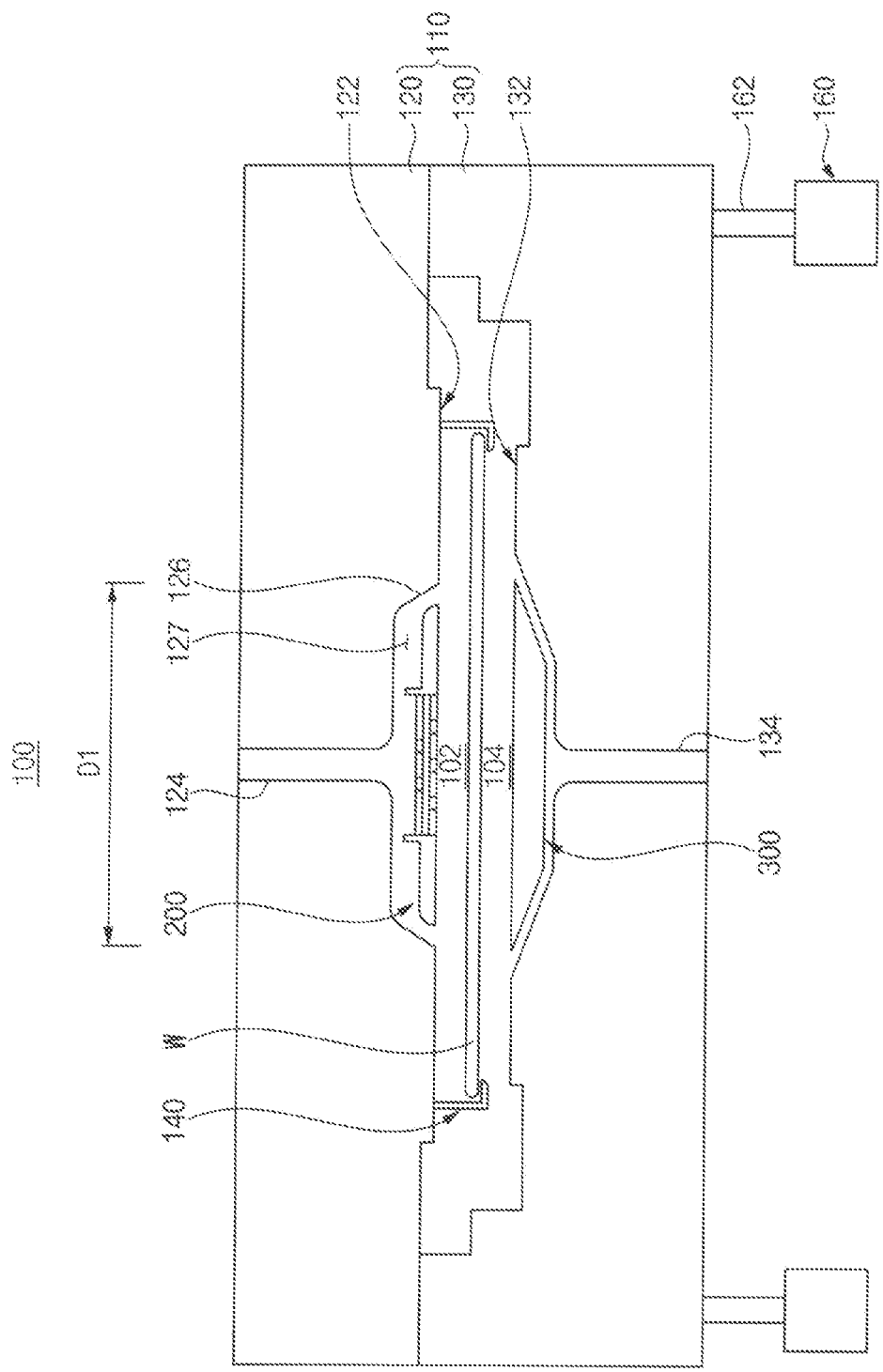
Figure 3:
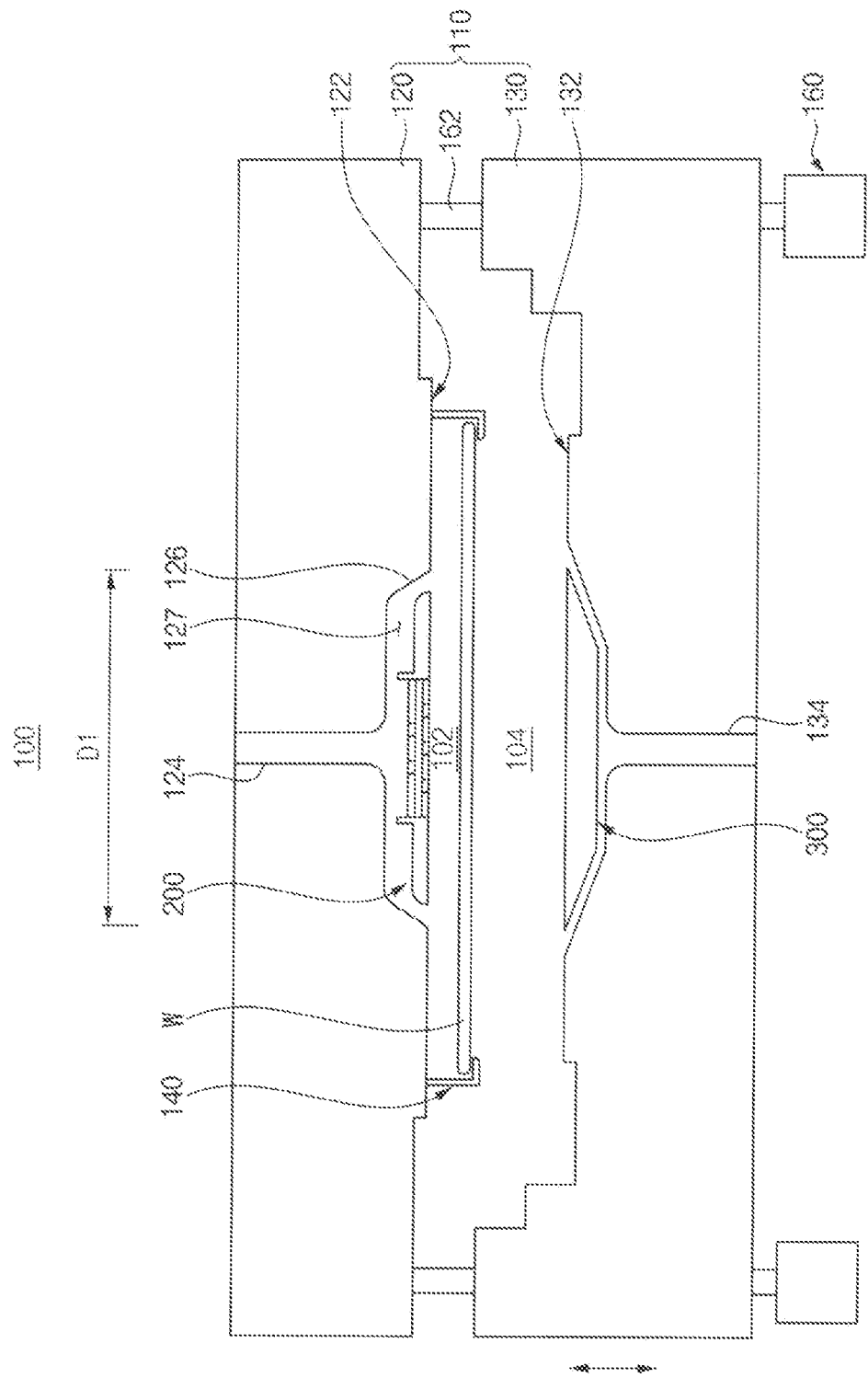
Figure 4:
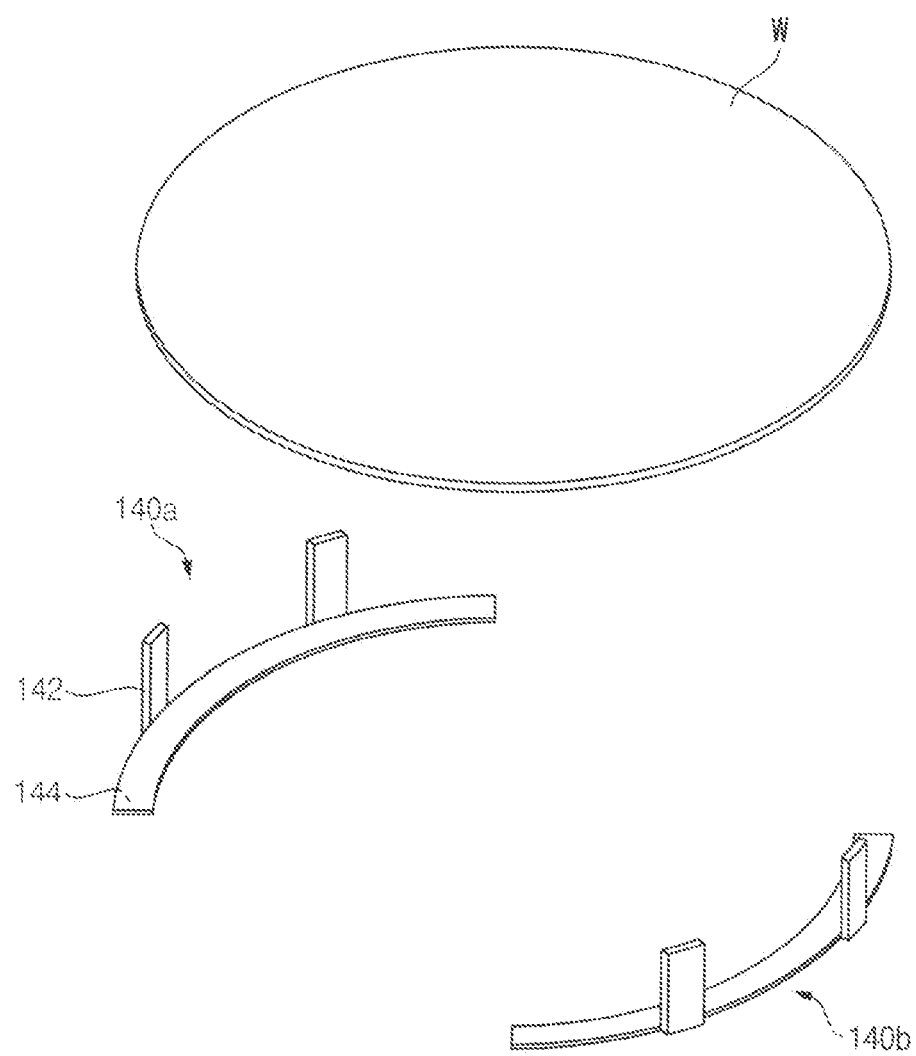
Figure 5:
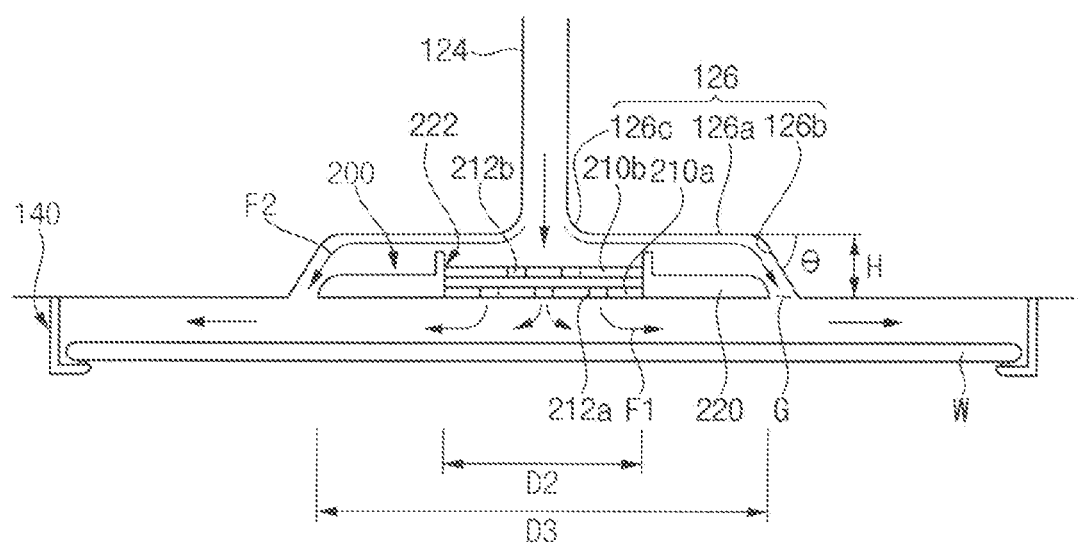
Figure 6:
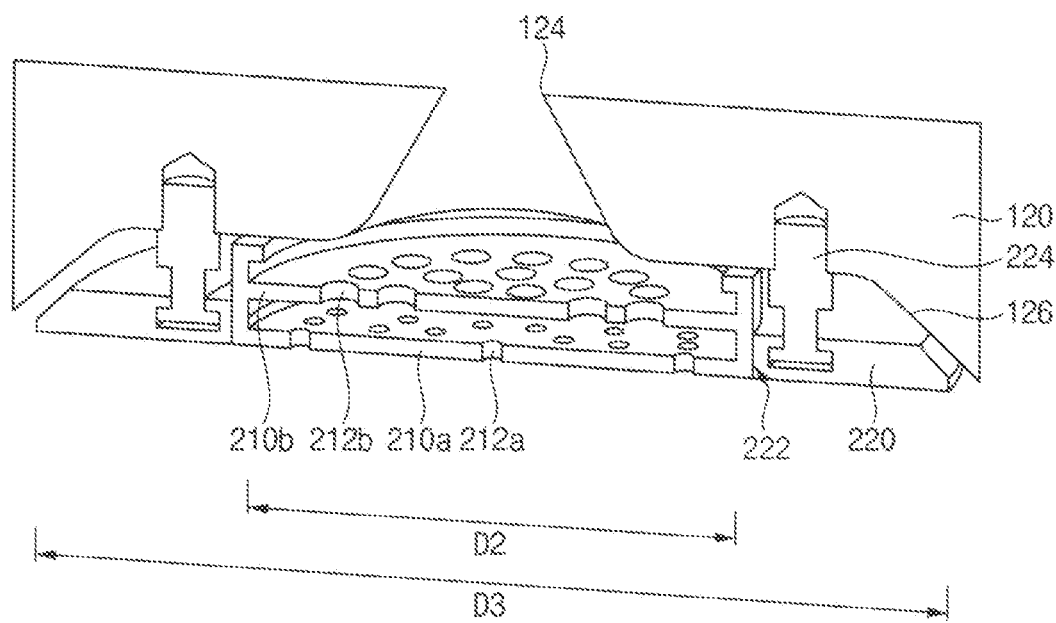
Figure 7:
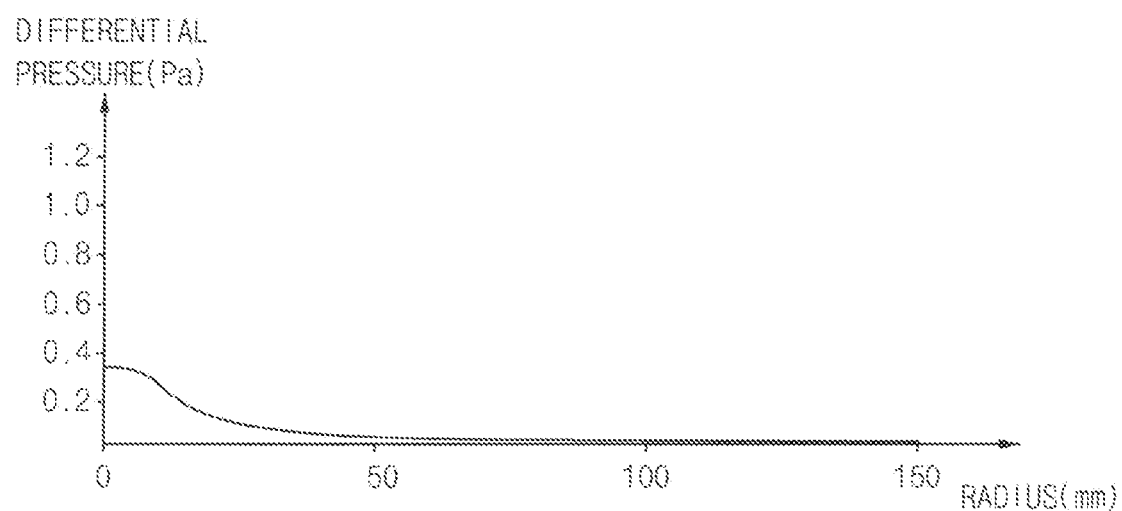

FIG. 2 is a cross-sectional view illustrating a substrate processing apparatus in accordance with example embodiments. FIG. 3 is a cross-sectional view illustrating a chamber of the substrate processing apparatus of FIG. 2, wherein the chamber is in an open state. FIG. 4 is a perspective view illustrating a substrate support of the substrate processing apparatus of FIG. 2. FIG. 5 is an enlarged cross-sectional view illustrating a baffle member of the substrate processing apparatus of FIG. 2. FIG. 6 is a partially cutaway perspective view illustrating a portion of the baffle member in FIG. 5. FIG. 7 is a graph illustrating a differential pressure of a fluid between a center and an edge region of a wafer in case that the baffle member of FIG. 5 is installed.

FIGS. 2 to 7, a substrate processing apparatus 100 may include a chamber 110, a substrate support 140, an upper supply port 124, an exhaust port 134 and a baffle member 200. Additionally, the substrate processing apparatus 100 may further include a lower supply port and a blocking plate 300.

In example embodiments, the substrate processing apparatus 100 may be an apparatus configured to support a substrate such as a wafer W and process the substrate by a supercritical drying process using a supercritical fluid. The substrate processing apparatus 100 may dry the substrate W on which a rinse process has been completed by using the supercritical fluid. The supercritical fluid may include carbon dioxide ($CO_2$) in a supercritical state.

For example, the supercritical process may include a cleaning process using a supercritical fluid, a drying process, an etching process, etc. The supercritical fluid may include a material at a temperature and pressure above its critical point having diffusivity, viscosity and surface tension like a gas-like, and solubility like a liquid. For example, the supercritical fluid may include carbon dioxide ($CO_2$), water ($H_2O$), methane ($CH_4$), ethane ($C_2H_6$), propane ($C_3H_8$), ethylene ($C_2H_4$), propylene ($C_3H_6$), methanol ($CH_3OH$), ethanol ($C_2H_5OH$), sulfur hexafluoride ($SF_6$), acetone ($C_3H_6O$), etc.

As illustrated in FIG. 3, the chamber 110 may provide a space for drying the substrate. The space may include a process space 102 and a buffer space 104. The process space 102 may be a region including a liquid solvent on the substrate W, and the buffer space 104 may be a region under the substrate W.

The chamber 110 may include an upper chamber 120 and a lower chamber 130. The upper chamber 110 may include a lower surface 122. The lower surface 122 of the upper chamber 120 may serve as an upper wall of the chamber 110. The lower chamber 130 may include an upper surface 132. The upper surface 132 of the lower chamber 130 may serve as a lower wall of the chamber 110.

As illustrated in FIGS. 2 and 3, the upper chamber 120 and the lower chamber 130 may be moved relative to each other by a driving mechanism 160 to engage each other so as to be switchable between a closed position for closing the chamber and an open position for opening the chamber. For example, at least one of the upper chamber 120 and the lower chamber 130 may move up and down along a lifting rod 162 to be coupled with or separated from each other. In the open position of the chamber 110, the substrate W may be loaded/unloaded into/from the chamber. In the closed position of the chamber 110, a supercritical drying process of the substrate W may be performed.

The substrate support 140 may be disposed in the chamber 110 and may support the substrate W when the substrate W is loaded into the chamber 110. The substrate support 140 may support the substrate W when the substrate W is loaded/unloaded into the chamber in the open position of the chamber 110. In addition, the substrate support 140 may be disposed in the chamber 110 and may support the substrate W when the substrate W is processed in the chamber. The substrate support 140 may support the substrate W when a supercritical fluid process is performed on the substrate W in the closed position of the chamber 110.

As illustrated in FIG. 4, the substrate support may include a pair of support members 140a and 140b that support the substrate W at positions spaced apart from the lower surface 122 of the upper chamber 120 by a predetermined distance. Each of the support members 140a and 140b may include a vertical rod 142 extending downward from the lower surface 122 of the upper chamber 120 and a horizontal rod 144 extending in a horizontal direction from one end of the vertical rod 132. Accordingly, the pair of support members 140a and 140b may support edge regions of the substrate W, respectively.

In example embodiments, the upper supply port 124 may be provided in the upper chamber 120. The upper supply port 124 may be provided in the central region of the upper chamber 120 to extend in a vertical direction. The supercritical fluid may be supplied to the process space 102 positioned above the substrate W through the upper supply port 124.

A recess 126 may be provided in the lower surface 122 of the upper chamber 120 to extending radially from an outlet of the upper supply port 124. The recess 126 may have a diffuser shape to radially guide the flow of the supercritical fluid introduced from the outlet of the upper supply port 124. A bottom surface of the recess 126 may be inclined downwardly so that a distance from the substrate W gradually decreases from the central region of the upper chamber 120 to a peripheral region.

The recess 126 may include a horizontal extension portion 126a extending in a direction parallel with an upper surface of the substrate W in a radial direction from the outlet of the upper supply port 124 and an inclined extension portion 126b extending obliquely at an angle θ from the horizontal extension portion 126a. Additionally, the recess 126 may further include a connection portion 126c that connects the outlet of the upper supply port 124 and the horizontal extension portion 126a and extends obliquely at a predetermined angle.

The horizontal extension portion 126a may have a predetermined depth H from the lower surface 122 of the upper chamber 120. The depth H of the horizontal extension portion 126a may be determined in consideration of a thickness of the baffle member 200 that is disposed in the recess 126. The inclined extension portion 126b may extend from the lower surface 122 of the upper chamber 120 toward the central region of the upper chamber 120. For example, the angle θ of the inclined extension portion 126b may be within a range of 10 degrees to 70 degrees.

The recess 126 may have a shape recessed from the lower surface 122 of the upper chamber 120 to provide the receiving space 127. As will be described later, the baffle member 200 may be disposed in the receiving space 127 of the recess 126. A diameter D1 of the recess 126 may be within 15% to 110% of a diameter of the substrate W. The diameter D1 of the recess 126 may be within the range of 50 mm to 315 mm.

Although it is not illustrated in the drawings, the lower supply port may be provided in the lower chamber 130. The lower supply port may be provided in the central region of the lower chamber 130 to extend in the vertical direction. The supercritical fluid may be supplied to the buffer space 104 positioned below the substrate W through the lower supply port.

The exhaust port 134 may be provided in the lower chamber 130. The exhaust port 134 may be provided in the central region of the lower chamber 130 adjacent to the lower supply port to extend in the vertical direction. The exhaust port 134 may exhaust the fluid used in the supercritical fluid process from the chamber 110. The exhaust fluid may include a supercritical fluid in which an organic solvent is dissolved. The fluid exhausted from the exhaust port 134 may be supplied to a regeneration device to be separated into a supercritical fluid and an organic solvent.

In example embodiments, the baffle member 200 may be disposed between the upper supply port 124 and the substrate W in the recess 126 of the upper chamber 120. The baffle member 200 may include at least one baffle plate 210a and 210b having a plurality of holes. The baffle plates 210a and 210b may extend in a direction parallel with the upper surface of the substrate W in the recess 126.

Referring to FIGS. 5 and 6, the baffle member 200 may include a base plate 220 and first and second baffle plates 210a and 210b disposed in a central region of the base plate 220 and sequentially stacked on each other.

The base plate 220 may be fixedly installed in the upper chamber 120 by a plurality of support rods 224 that extend downward from the inner surface of the recess 126. The base plate 220 may be spaced apart from the inner surface of the recess 126 by a predetermined distance. A peripheral region of the base plate 220 may be spaced apart from the inner surface of the recess 126 by a predetermined distance G.

Referring to FIG. 5, the first and second baffle plates 210a and 210b may be sequentially stacked in a cavity 222 formed in the central region of the base plate 220. The first and second baffle plates 210a and 210b may be vertically spaced apart from each other. A diameter D2 of the cavity 222 may be within 10% to 95% of the diameter of the substrate W. A diameter D3 of the base plate 220 may be within 15% to 100% of the diameter of the substrate W. For example, the diameter D2 of the cavity 222 may be within a range of 30 mm to 280 mm. The diameter D3 of the base plate 220 may be within the range of 34 mm to 300 mm.

As illustrated in FIG. 6, the baffle member 200 may include the first baffle plate 210a and the base plate 220 that are integrally formed. The base plate 220 may be provided around the first baffle plate 210a. The second baffle plate 210b may be stacked on the first baffle plate 210a.

The first baffle plate 210a may include a plurality of first holes 212a. The first holes 212a may be formed to be arranged radially in the first baffle plate 210a. The first holes 212a may be arranged to be spaced apart from each other at predetermined intervals along a circumferential direction and a radial direction. The first holes 212a may have the same or different diameters. The second baffle plate 210b may include a plurality of second holes 212b. The second holes 212b may be formed to be arranged radially in the second baffle plate 210b. The second holes 212b may be arranged to be spaced apart from each other at predetermined intervals along a circumferential direction and a radial direction. The second holes 212b may have the same or different diameters. The diameter of the first hole 212a may be smaller than the diameter of the second hole 212b. Alternatively, the diameter of the first hole 212a may be the same as the diameter of the second hole 212b. For example, the first and second holes 212a and 212b may have a diameter of 1 mm to 5 mm. The positions and diameters of the first and second holes 212a and 212b may be determined in consideration of the velocity of the fluid supplied onto the substrate W through the first and second baffle plates 210a and 210b, and all or some of the first and second holes may or may not overlap with each other.

As illustrated in FIG. 5, a first portion F 1 of the supercritical fluid introduced from the upper supply port 124 may be distributed onto the upper surface of the substrate W through the first and second holes 212a of the first and second baffle plates 210a and 210b, and a second portion of the supercritical fluid may be distributed onto the upper surface of the substrate W through the periphery of the baffle member 200, that is, the gap G between the periphery of the base plate 220 and the inner surface of the recess 126.

The first portion of the supercritical fluid may pass through several flow paths formed by the first and second holes 212a and 212b of the first and second baffle plates 210a and 210b and then may be supplied to the upper surface of the substrate W. The second portion of the supercritical fluid injected through the gap G between the periphery of the base plate 220 and the inner surface of the recess 126 may flow toward the edge of the substrate W so as not to cause a fluid velocity difference between the center and the edge of the substrate W. Meanwhile, since no holes are formed in the base plate 220 disposed around the baffle plates, a vortex flow between the baffle member 200 and the inner surface of the recess 126 may be prevented.

Referring to FIG. 7, when the supercritical fluid injected through the upper supply port 124 is supplied to the upper portion of the substrate W through the baffle member 200, the differential pressure of the fluid delivered to the center of the substrate W may be greater than the differential pressure of the fluid delivered to the edge of the substrate W. However, in case that the fluid is supplied to the substrate W through the baffle member 200, the differential pressure of the fluid between the center and the edge region of the substrate W is about 0.4 Pa, but it may be seen that the differential pressure is significantly reduced compared to the case without the baffle member.

As the fluid injected through the upper supply port 124 is distributed into several branches by the baffle member 200 and the flow path is lengthened, the speed of reaching the upper portion of the substrate W may be reduced. The baffle member 200 may prevent the supercritical fluid injected through the upper supply port 124 from being directly sprayed toward the upper surface of the substrate W, and may induce the supercritical fluid to be uniformly sprayed from the center of the substrate W toward the edge region. Accordingly, it may be possible to prevent a chemical liquid applied on the upper surface of the substrate W from being lost due to the flow, and uniform drying processing may be possible over the entire area of the substrate W, thereby improving substrate processing performance.

In example embodiments, the blocking plate 300 may be disposed between the upper surface 132 of the lower chamber 130 and the substrate W. The blocking plate 300 may be installed to be spaced apart from the upper surface 132 of the lower chamber 130 by a predetermined distance. The blocking plate 300 may be fixed on the upper surface 132 of the lower chamber 130 by a support rod (not illustrated). The blocking plate 300 may include a plate having a predetermined thickness occupying a predetermined space in the buffer space 104. The blocking plate 300 may block direct injection of the supercritical fluid from the lower supply port to a lower surface of the substrate W.

Additionally, a volume of the buffer space 104 may be reduced by the blocking plate 300. The volume of the buffer space 104 may be smaller than a volume of the processing region 102. Accordingly, the amount of the supercritical fluid present in the buffer space 104 under the substrate W may be relatively less than the amount of the supercritical fluid present in the process space 102 above the substrate W. As a structure such as the blocking plate 300 is arranged in the buffer space under the substrate W, the amount of the supercritical fluid used in the drying process may be reduced while maintaining process performance to thereby reduce process time.

In example embodiments, the substrate processing apparatus 100 may include a heater provided in at least one of the upper chamber 120 and the lower chamber 130 of the chamber 110. The heater may heat the inside of the chamber to maintain the temperature of the supercritical fluid supplied into the chamber above the critical temperature.

As mentioned above, the substrate processing apparatus 100 may include the baffle member 200 disposed between the upper supply port 124 and the substrate W in the recess 126 formed in the lower surface 122 of the upper chamber 120 and having the at least one baffle plate 210a and 210b that has a plurality of the holes 212a and 212b. The baffle member 200 may serve as an inertia relief member for relieving the flow velocity of the fluid supplied from the upper portion of the chamber 110 toward the substrate W. The speed of the supercritical fluid supplied to the upper surface of the substrate W through the upper supply port 124 may be reduced by the baffle member 200, and thus, the differential pressure of the fluid between the center and the edge region of the substrate W may be reduced.

Accordingly, in a process of drying a developer using the supercritical fluid after a developer treatment process during a semiconductor photolithography process, the inertia force transmitted to the upper surface of the substrate W by the supercritical fluid may be reduced to prevent rupture of the liquid film of a rinse chemical or damage such as collapse of a pattern on the wafer.

Figure 8:
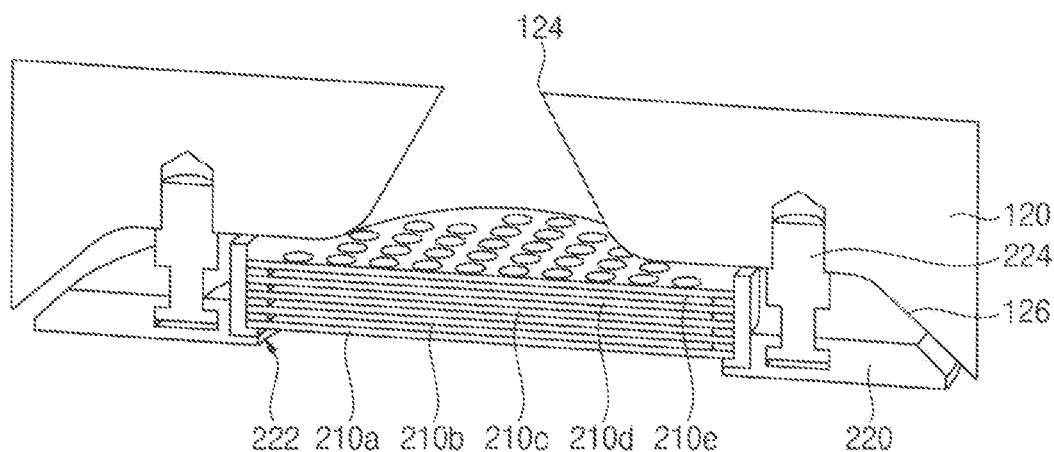

FIG. 8 is a partially cutaway perspective view illustrating a portion of a baffle member in accordance with example embodiments.

Referring to FIG. 8, a baffle member 200 may include a base plate 220 and first, second, third, fourth and fifth baffle plates 210a, 210b, 210c, 210d and 210e disposed in a central region of the base plate 220 and sequentially stacked on one another.

Each of the first, second, third, fourth and fifth baffle plates 210a, 210b, 210c, 210d and 210e may include a plurality of holes. Positions and diameters of the holes may be determined in consideration of a velocity of the fluid supplied onto a substrate W through the first, second, third, fourth and fifth baffle plates 210a, 210b, 210c, 210d and 210e. It may be appreciated that the baffle member 200 is illustrated to include five baffle plates, but it is not limited thereto.

Figure 9:
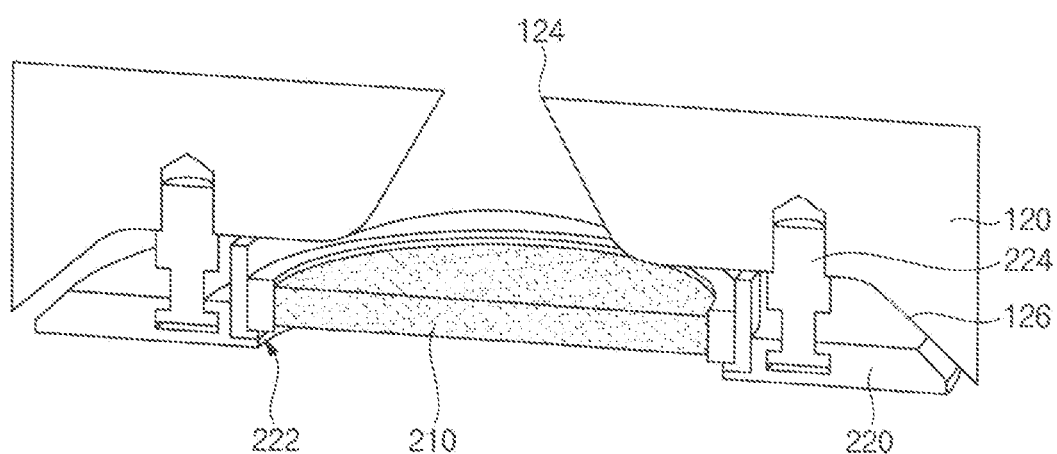

FIG. 9 is a partially cutaway perspective view illustrating a portion of a baffle member in accordance with example embodiments.

Referring to FIG. 9, a baffle member 200 may include a base plate 220 and one baffle plate 210 disposed in a central region of the base plate 220.

The baffle plate 210 may be installed in a cavity 222 formed in the central region of the base plate 220. The baffle plate 210 may include a porous media plate. The porosity of the porous media plate may be within a range of 5% to 70%.

The above substrate processing apparatus may be used to manufacture semiconductor devices including logic devices and memory devices. For example, the semiconductor device may be applied to logic devices such as central processing units (CPUs), main processing units (MPUs), or application processors (APs), or the like, and volatile memory devices such as DRAM devices, SRAM devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A substrate processing apparatus, comprising:
a chamber including an upper chamber and a lower chamber coupled to each other to provide a space for processing a substrate;
a substrate support configured to support the substrate within the chamber;
an upper supply port provided in the upper chamber and configured to supply a supercritical fluid on an upper surface of the substrate within the chamber;
a recess provided in a lower surface of the upper chamber, the recess including a horizontal extension portion extending in a direction parallel with the upper surface of the substrate in a radial direction from an outlet of the upper supply port and an inclined extension portion extending obliquely at an angle from the horizontal extension portion; and
a baffle member disposed within the recess between the upper supply port and the substrate, the baffle member including at least one baffle plate having a plurality of holes, wherein the baffle member includes: a base plate and the at least one baffle plate provided in a central region of the base plate, and wherein the baffle member includes first and second baffle plates within a cavity formed in the central region of the base plate and sequentially stacked on each other.

2. The substrate processing apparatus of claim 1, wherein the cavity has a diameter within a range of 15% to 110% of a diameter of the substrate, and the base plate has a diameter within a range of 15% to 100% of the diameter of the substrate.

3. The substrate processing apparatus of claim 1, wherein the baffle plate includes a porous media plate, and the porosity of the porous media plate is within a range of 5% to 70%.

4. The substrate processing apparatus of claim 1, wherein the angle of the inclined extension portion is within a range of 10 degrees to 70 degrees with respect to the horizontal extension portion.

5. The substrate processing apparatus of claim 1, wherein a peripheral region of the baffle member is spaced apart from an inner surface of the recess by a distance.

6. The substrate processing apparatus of claim 1, wherein the substrate support includes:
a vertical rod extending downward from the lower surface of the upper chamber; and
a horizontal rod extending in a horizontal direction from one end of the vertical rod.

7. The substrate processing apparatus of claim 1, wherein a diameter of the recess is within 15% to 110% of a diameter of the substrate.

8. The substrate processing apparatus of claim 1, further comprising:
a blocking plate provided in a space under the substrate.

9. A substrate processing apparatus, comprising:
a chamber configured to provide a space for processing a substrate;
a substrate support configured to support the substrate within the chamber;
an upper supply port provided in an upper portion of the chamber and configured to supply a supercritical fluid on an upper surface of the substrate;
a recess provided in the upper portion of the chamber, the recess extending radially from an outlet of the upper supply port; and
a baffle member disposed within the recess, the baffle member including at least one baffle plate, the at least one baffle plate extending in a direction parallel with the upper surface of the substrate and having a plurality of holes, wherein the baffle member includes: a base plate and the at least one baffle plate provided in a central region of the base plate, and wherein the baffle member includes first and second baffle plates within a cavity formed in the central region of the base plate and sequentially stacked on each other.

10. The substrate processing apparatus of claim 9, wherein the cavity has a diameter within a range of 15% to 110% of a diameter of the substrate, and the base plate has a diameter within a range of 15% to 100% of the diameter of the substrate.

11. The substrate processing apparatus of claim 9, wherein a peripheral region of the baffle member is spaced apart from an inner surface of the recess by a distance.

12. The substrate processing apparatus of claim 9, wherein a diameter of the recess is within 15% to 110% of a diameter of the substrate.

13. The substrate processing apparatus of claim 9, wherein the baffle plate includes a porous media plate, and the porosity of the porous media plate is within a range of 5% to 70%.

14. The substrate processing apparatus of claim 9, wherein the recess includes a horizontal extension portion extending in a direction parallel with the upper surface of the substrate in a radial direction from the outlet of the upper supply port and an inclined extension portion extending obliquely at an angle from the horizontal extension portion, and wherein the angle of the inclined extension portion is within a range of 10 degrees to 70 degrees with respect to the horizontal extension portion.

15. The substrate processing apparatus of claim 9, further comprising:

a blocking plate provided in a space under the substrate.

16. A substrate processing apparatus, comprising:

a chamber including an upper chamber and a lower chamber coupled to each other to provide a space for processing a substrate;

a substrate support configured to support the substrate within the chamber;

an upper supply port provided in the upper chamber and configured to supply a supercritical fluid on an upper surface of the substrate within the chamber;

an exhaust port provided in the lower chamber and configured to exhaust a fluid from the chamber;

a lower supply port provided in the lower chamber adjacent to the exhaust port and configured to supply a supercritical fluid into the chamber; and a baffle member provided between the upper supply port and the substrate, the baffle member including a base plate fixedly installed in the upper chamber by a plurality of support rods that extend downward from a lower surface of the upper chamber and having a cavity in a central region and at least one baffle plate extending in a direction parallel with the upper surface of the substrate and having a plurality of holes.

* * * * *